(12) United States Patent
Sakashita et al.

(10) Patent No.: US 6,448,602 B1
(45) Date of Patent: Sep. 10, 2002

(54) SEMICONDUCTOR MEMORY DEVICE WITH IMPROVED ARRANGEMENT OF MEMORY BLOCKS AND PERIPHERAL CIRCUITS

(75) Inventors: Narumi Sakashita; Kazutami Arimoto, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 1084 days.

(21) Appl. No.: 08/627,313

(22) Filed: Apr. 3, 1996

(30) Foreign Application Priority Data

Sep. 6, 1995 (JP) .............................................. 7-229175

(51) Int. Cl.[7] .......................... H01L 33/00; H01L 29/78
(52) U.S. Cl. ........................................ 257/303; 257/315
(58) Field of Search ................................ 257/203, 254, 257/315, 390; 365/53, 61, 72

(56) References Cited

U.S. PATENT DOCUMENTS 4,864,381 A * 9/1989 Seefeldt et al. ............. 257/203
5,214,657 A * 5/1993 Farnworth et al. .......... 257/202
5,222,042 A * 6/1993 Ichiguchi ................ 365/189.01
5,229,629 A * 7/1993 Koike ........................ 257/202
5,416,347 A * 5/1995 Katto et al. ................. 257/296
5,488,585 A * 1/1996 Kim ........................... 365/210
5,512,766 A * 4/1996 Kusunoki et al. ........... 257/390
5,521,541 A   5/1996 Okamura

FOREIGN PATENT DOCUMENTS

JP            62-180594           8/1987

OTHER PUBLICATIONS

Kiyoo Ito, VSLI Memory, Baifukan Press, pp. 19, 132 and 133. Semiconductor Memories, Betty Prince, Wiley Publishers, pp. 170–171, and 472–473.

* cited by examiner

Primary Examiner—Stephen D. Meier
(74) Attorney, Agent, or Firm—McDermott, Will & Emery

(57) ABSTRACT

A DRAM includes a semiconductor substrate and unit blocks. Each unit block includes a peripheral circuit and eight memory blocks arranged to surround the peripheral circuit. Each memory block includes a plurality of word lines, a plurality of bit lines, a plurality of memory cells, a row decoder, and a column decoder.

13 Claims, 10 Drawing Sheets

FIG. 6

|    | C1  | C2  | C3  | C4  | C5  | C6  | C7  |
|----|-----|-----|-----|-----|-----|-----|-----|
| L1 | B1  | B20 | B19 | B18 | B17 | B16 | B15 |
| L2 | B2  | B21 | B32 | B31 | B30 | B29 | B14 |
| L3 | B3  | B22 | PERIPHERAL CIRCUIT || | B28 | B13 |
| L4 | B4  | B23 | B24 | B25 | B26 | B27 | B12 |
| L5 | B5  | B6  | B7  | B8  | B9  | B10 | B11 |

|    | C1 | C2  | C3  | C4  | C5  | C6  |
|----|----|-----|-----|-----|-----|-----|
| L1 | B1 | B14 | B13 | B12 | B11 | B10 |
| L2 | B2 | B15 | PERIPHERAL CIRCUIT || B16 | B9  |
| L3 | B3 | B4  | B5  | B6  | B7  | B8  |

|    | C1 | C2  | C3  | C4  | C5  | C6  | C7  |
|----|----|-----|-----|-----|-----|-----|-----|
| L1 | B1 | B22 | B21 | B20 | B19 | B18 | B17 |
| L2 | B2 | B23 | B32 | B31 | B30 | B29 | B16 |
| L3 | B3 | PERIPHERAL CIRCUIT |||| | B15 |
| L4 | B4 | | | | | | B14 |
| L5 | B5 | B24 | B25 | B26 | B27 | B28 | B13 |
| L6 | B6 | B7  | B8  | B9  | B10 | B11 | B12 |

|    | C1 | C2  | C3  | C4  | C5  | C6  |
|----|----|-----|-----|-----|-----|-----|
| L1 | B1 | B18 | B17 | B16 | B15 | B14 |
| L2 | B2 | B19 | B26 | B25 | B24 | B13 |
| L3 | B3 | \multicolumn{3}{PERIPHERAL CIRCUIT} | | | B12 |
| L4 | B4 | B20 | B21 | B22 | B23 | B11 |
| L5 | B5 | B6  | B7  | B8  | B9  | B10 |

11 — PERIPHERAL CIRCUIT

FIG. 10

|    | C1 | C2  | C3  | C4  | C5  | C6  | C7  |
|----|----|-----|-----|-----|-----|-----|-----|
| L1 | B1 | B18 | B17 | B16 | B15 | B14 | B13 |
| L2 | B2 | B19 | PERIPHERAL | CIRCUIT | | B22 | B12 |
| L3 | B3 | B20 | | | | B21 | B11 |
| L4 | B4 | B5  | B6  | B7  | B8  | B9  | B10 |

|    | C1 | C2  | C3  | C4  | C5  | C6  | C7  | C8  | C9  |
|----|----|-----|-----|-----|-----|-----|-----|-----|-----|
| L1 | B1 | B30 | B29 | B28 | B27 | B26 | B25 | B24 | B23 |
| L2 | B2 | B31 | B52 | B51 | B50 | B49 | B48 | B47 | B22 |
| L3 | B3 | B32 | B53 | B64 | B63 | B62 | B61 | B46 | B21 |
| L4 | B4 | B33 | PERIPHERAL | CIRCUIT | | | B60 | B45 | B20 |
| L5 | B5 | B34 | | | | | B59 | B44 | B19 |
| L6 | B6 | B35 | B54 | B55 | B56 | B57 | B58 | B43 | B18 |
| L7 | B7 | B36 | B37 | B38 | B39 | B40 | B41 | B42 | B17 |
| L8 | B8 | B9  | B10 | B11 | B12 | B13 | B14 | B15 | B16 |

11

|    | C1  | C2  | C3  | C4  | C5  | C6  | C7  | C8  |
|----|-----|-----|-----|-----|-----|-----|-----|-----|
| L1 | B1  | B30 | B29 | B28 | B27 | B26 | B25 | B24 |
| L2 | B2  | B31 | B52 | B51 | B50 | B49 | B48 | B23 |
| L3 | B3  | B32 | B53 |     |     | B64 | B47 | B22 |
| L4 | B4  | B33 | B54 | PERI-PHERAL CIRCUIT | | B63 | B46 | B21 |
| L5 | B5  | B34 | B55 |     |     | B62 | B45 | B20 |
| L6 | B6  | B35 | B56 |     |     | B61 | B44 | B19 |
| L7 | B7  | B36 | B57 | B58 | B59 | B60 | B43 | B18 |
| L8 | B8  | B37 | B38 | B39 | B40 | B41 | B42 | B17 |
| L9 | B9  | B10 | B11 | B12 | B13 | B14 | B15 | B16 |

— 11 (points to peripheral circuit region)

SEMICONDUCTOR MEMORY DEVICE WITH IMPROVED ARRANGEMENT OF MEMORY BLOCKS AND PERIPHERAL CIRCUITS

BACKGROUND OF THE INVENTION

1. Field of the Invention

The present invention relates to semiconductor memory devices and, more particularly, to arrangement of memory blocks and peripheral circuits thereof in a semiconductor memory device.

2. Description of the Background Art

In these years, semiconductor memory devices, particularly DRAMs (Dynamic Random Access Memories), are highly integrated with even larger capacity. With such increase in capacity, a memory cell array is divided into a great number of memory blocks (subarrays) because bit lines and word lines are divided into multiple bit lines and word lines to cope with increase in power consumption and delay time and decrease in signal voltage in a memory cell. Generally, since a semiconductor memory device has storage capacity of $2^N$ bits which is the Nth power of 2, memory blocks are arranged in an even number of rows and columns.

FIGS. 16 and 17 show layouts of conventional DRAMs. These figures are shown in, for example, FIG. 1.14 in *VLSI Memory* by Kiyoo Ito, published by Baifukan Press, p. 19.

FIG. 16 shows an internal structure of a DRAM of 64 K bits. Referring to FIG. 16, the DRAM includes a semiconductor substrate 10, memory cell arrays MA1 and MA2 formed on semiconductor substrate 101 a row decoder 42 arranged to cross vertically over memory cell array MA1 or MA2, a column decoder 43 arranged to cross horizontally over memory cell array MA1 or MA2, a peripheral circuit 11 for memory cell array MA1, and a peripheral circuit 12 for memory cell array MA2.

FIG. 17 shows an internal structure of a DRAM of 64 M bits. Referring to FIG. 17, this DRAM includes semiconductor substrate 10, memory cell arrays MA1–MA4 formed on semiconductor substrate 10, row decoder 42 arranged to cross horizontally over memory cell array MA1–MA4, column decoder 43 arranged adjacent to one shorter side of each of memory cell arrays MA1–MA4, and a peripheral circuit 11 for memory cell arrays MA1–MA4.

Each of memory cell arrays MA1–MA4 shown in FIG. 17 is divided into 64 subarrays. FIG. 17 shows only subarrays SA1–SA64 in memory cell array MA3. Since this DRAM has storage capacity of 64 M bits, each of memory cell arrays MA1–MA4 includes 16M (16×220) memory cells, and each of subarrays SA1–SA64 includes 256 K (256×210) memory cells. Therefore, in this DRAM subarrays are arranged in 2 K rows and 128 columns.

Peripheral circuit 11 includes a control circuit (not shown) for controlling memory cell arrays MA1–MA4 and an input/output interface circuit (not shown). The input/output interface circuit is a circuit for converting an externally applied control signal and the write data to an internal signal to be supplied to the control circuit or outputting to outside the readout data transferred from memory cell arrays MA1–MA4 to the control circuit. The control circuit is a circuit for controlling memory cell arrays MA1–MA4 based on the data or the control signal applied to the input/output interface circuit.

Since a DRAM includes $2^N$ memory cells, which is the Nth power of 2, it has been common to arrange subarrays in even number of rows and even number of columns.

However, with an increase in capacity, the number of subarrays tends to grow increasingly. As a result, it is difficult to implement a DRAM of 1 G bit by the arrangement methods shown in FIGS. 16 and 17. More specifically, a memory cell array must be divided into multiple subarrays in a DRAM of 1 G bit, leading to unequal distances from the peripheral circuit to respective subarrays and to unequal signal delays.

SUMMARY OF THE INVENTION

One object of the present invention is to provide a semiconductor memory device having a large storage capacity.

Another object of the present invention is to provide a semiconductor memory device with equal signal delay.

Still another object of the present invention is to provide a novel method of arranging a plurality of memory blocks and a peripheral circuit thereof.

According to one aspect of the present invention, a semiconductor memory device includes a semiconductor substrate, a plurality of memory blocks, and a peripheral circuit therefor. The plurality of memory blocks are arranged on the semiconductor substrate to surround the center thereof. Each memory block includes a plurality of word lines, a plurality of bit lines crossing the word lines and a plurality of memory cells each corresponding to a crossing point of the word line and the bit line. The peripheral circuit is arranged on the semiconductor substrate at the center thereof.

According to another aspect of the present invention, a semiconductor memory device includes eight memory blocks and a peripheral circuit therefor. The eight memory blocks are arranged in three rows and three columns except for the second row of the second column. Each memory block includes a plurality of word lines, a plurality of bit lines crossing the word lines and a plurality of memory cells each corresponding to a crossing point of the word line and the bit line. The peripheral circuit is disposed at the second row of the second column.

According to still another aspect of the present invention, a semiconductor memory device includes four unit blocks. Each unit block includes eight memory blocks and a peripheral circuit therefor. Four unit blocks are arranged in two rows and two columns. Eight memory blocks are arranged in three rows and three columns except for the second row of the second column. Each memory block includes a plurality of word lines, a plurality of bit lines crossing the word lines and a plurality of memory cells each corresponding to a crossing point of the word line and the bit line. The peripheral circuit is disposed at the second row of the second column.

Therefore, according to the present invention, the distance from the peripheral circuit to each memory block is substantially equal, resulting in substantially equal signal delay. Consequently, a semiconductor memory device with a large storage capacity can be easily implemented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 6–15 show layouts of a DRAM according to second through eleventh embodiments of the present invention.

DESCRIPTION OF THE PREFERRED EMBODIMENTS

Now, embodiments of the present invention will be described in detail with reference to the drawings. The identical numerals in the figures indicate the identical or corresponding portions.

First Embodiment

Figure 1:
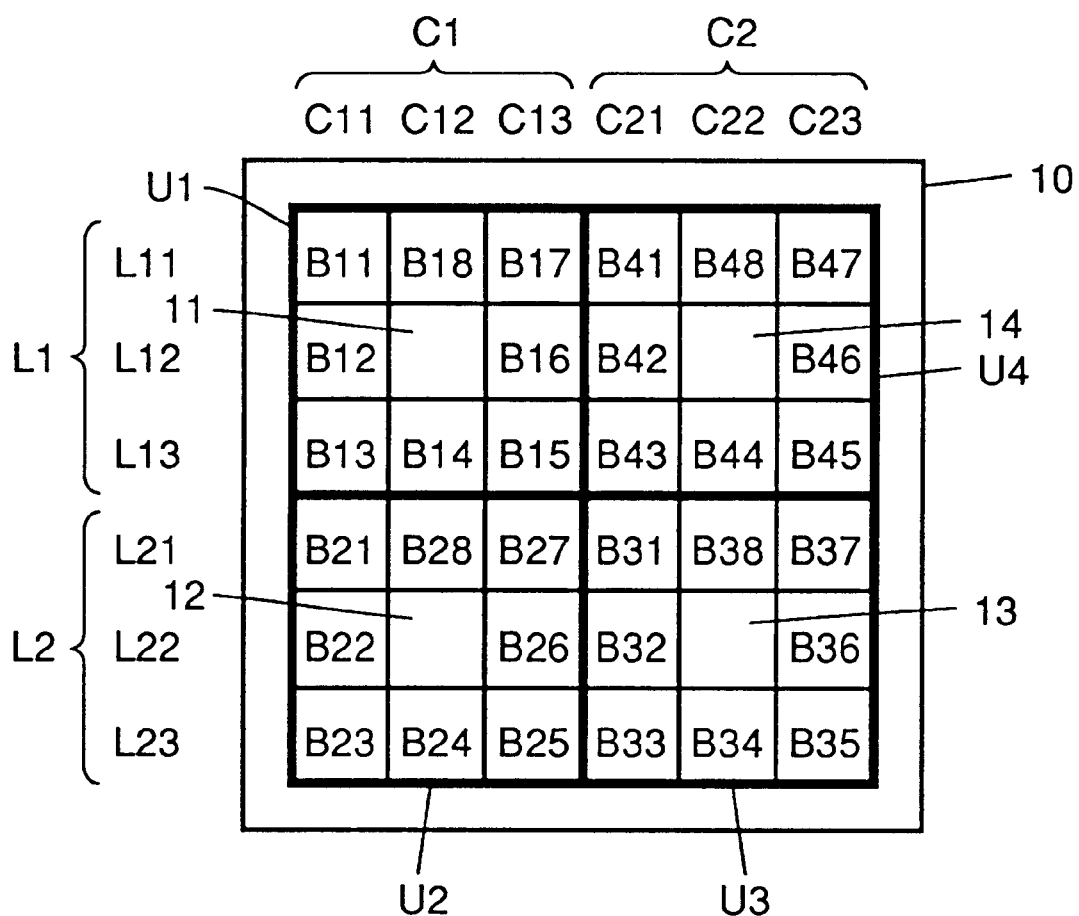
FIG. 1 shows a layout of a DRAM according to a first embodiment of the present invention.

FIG. 1 shows a layout of a DRAM according to the first embodiment of the present invention. Referring to FIG. 1, this DRAM includes semiconductor substrate 10, and four unit blocks U1–U4 arranged on semiconductor substrate 10 in two rows L1 and L2 and two columns C1 and C2. Each of unit blocks U1–U4 includes eight memory blocks and a peripheral circuit for the eight memory blocks. More specifically, unit block U1 includes memory blocks B11–B18 arranged in three rows L11–L13 and three columns C11–C13 except for the second row of the second column thereof (L12, C12), and peripheral circuit 11 disposed at the second row of the second column (L12, C12). Unit block U2 includes memory blocks B21–B28 arranged in three rows L21–L23 and three columns C11–C13 except for the second row of the second column thereof (L22, C12) and peripheral circuit 12 disposed at the second row of the second column (L22, C12). Unit block U3 includes memory blocks B31–B38 arranged in three rows L21–L23 and three columns C21–C23 except for the second row of the second column thereof (L22, C22) and peripheral circuit 13 disposed at the second row of the second column (L22, C22). Unit block U4 includes memory blocks B41–B48 arranged in three rows L11–L13 and three columns C21–C23 except for the second row of the second column thereof (L12, C22) and peripheral circuit 14 disposed at the second row of the second column (L12, C22).

If the DRAM has storage capacity of 1 G bit, each of memory blocks B11–B18, B21–B28, B31–B38, and B41–B48 includes 32 M ($32 \times 2^{20}$) memory cells 20, and therefore each of unit blocks U1–U4 includes 256 M ($256 \times 2^{20}$) memory cells 20.

Figure 2:
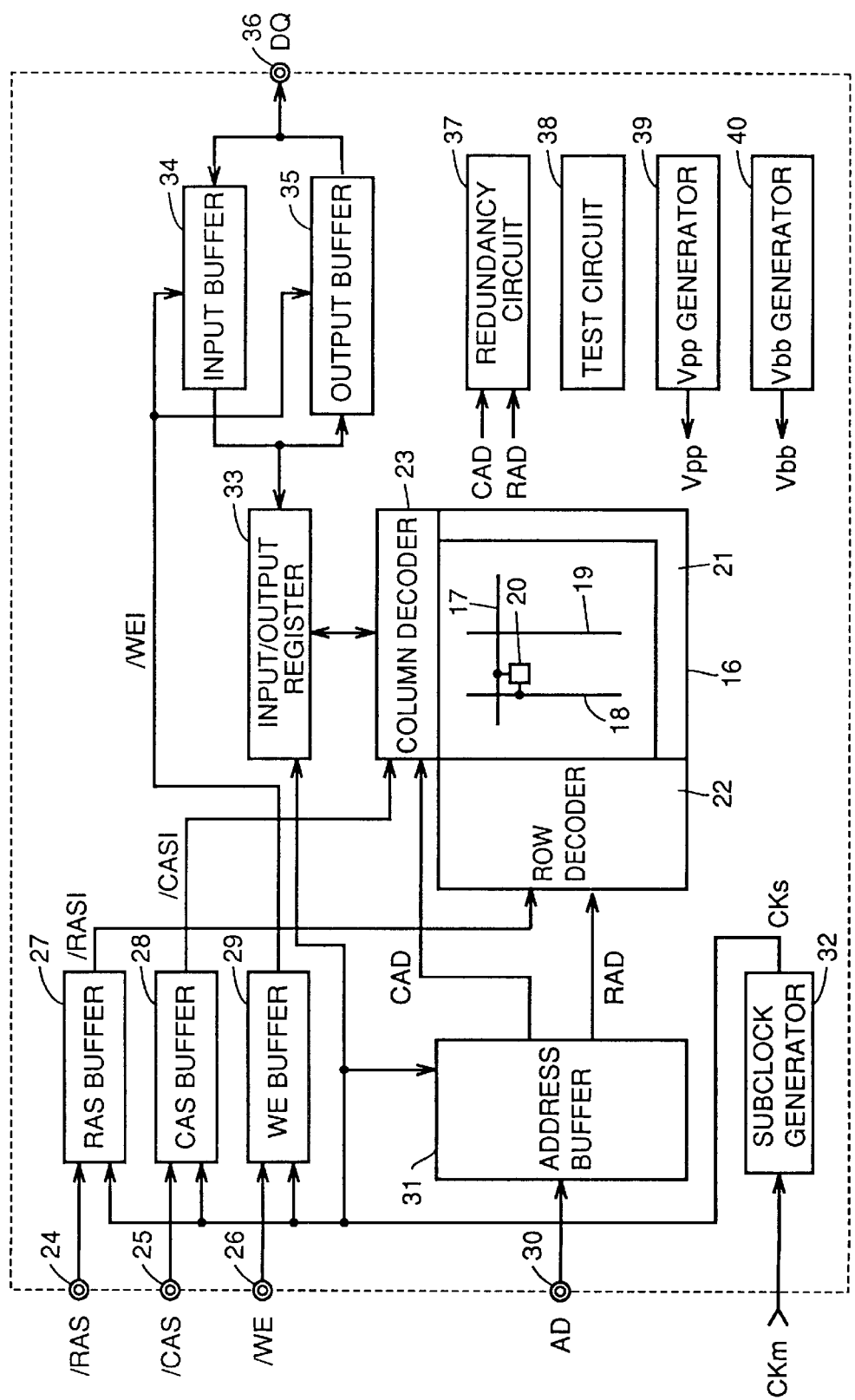
FIG. 2 is a block diagram showing a structure of each unit block in FIG. 1.

FIG. 2 is a block diagram showing in detail a structure of each of unit blocks U1–U4 shown in FIG. 1. Referring to FIG. 2, the unit block includes a memory cell array 16, a row decoder 22, a column decoder 23, control input terminals 24–26, a row address strobe (RAS) buffer 27, a column address strobe (CAS) buffer 28, a write enable (WE) buffer 29, an address input terminal 30, an address buffer 31, a subclock generator 32, an input/output register 33, an input buffer 34, an output buffer 35, and a data input/output terminal 36. Input buffer 34 and output buffer 35 form an input/output interface circuit.

Memory cell array 16 is divided into eight memory blocks described above. Memory cell array 16 includes a plurality of word lines, a plurality of bit lines crossing the word lines, and a plurality of memory cells each corresponding to a crossing point of the word line and the bit line. FIG. 2 shows one word line 17, a pair of bit lines 18 and 19, and one memory cell 20.

Memory cell array 16 further includes a spare memory cell array 21. Spare memory cell array 21 includes a plurality of spare word lines (not shown) substitutable with the word lines, a plurality of spare bit lines (not shown) substitutable with the bit lines, and a plurality of spare memory cells (not shown) substitutable with the memory cells.

Control input terminals 24–26 receive an external row address strobe signal/RAS, an external column address strobe signal/CAS, and an external write enable signal/WE, respectively, which are applied externally. RAS buffer 27 is connected to control input terminal 24 and is responsive to external row address strobe signal/RAS to generate an internal row address strobe signal/RASI. CAS buffer 28 is connected to control input terminal 25 and is responsive to external column address strobe signal/CAS to generate an internal column address strobe signal/CASI. WE buffer 29 is connected to control input terminal 26 and is responsive to external write enable signal/WE to generate an internal write enable signal/WEI.

Address input terminal 30 receives an external address signal AD. Address buffer 31 is connected to address input terminal 30 and is responsive to external address signal AD to generate a row address signal RAD or a column address signal CAD. Row decoder 22 is responsive to internal row address strobe signal/RASI to incorporate row address signal RAD, and is responsive to the incorporated row address signal RAD to select a word line. Column decoder 23 is responsive to internal column address strobe signal/CASI to incorporate column address signal CAD, and is responsive to the incorporated column address signal CAD to select a bit line.

Since this DRAM is a synchronous semiconductor memory device, it operates in response to the externally applied clock signal. Therefore, subclock generator 32 generates a subclock signal CKs in response to a main clock signal CKm generated by a main clock generator described later. Subclock signal CKs is applied to RAS buffer 27, CAS buffer 28, WE buffet 29, address buffer 31, input/output register 33, and the like.

In a read mode, data is transferred to input/output register 33 from several bit lines selected by column decoder 23, and the transferred data is output externally through output buffer 35 and data input/output terminal 36. On the other hand, in a write mode, data DQ is applied to input/output register 33 through data input/output terminal 36 and input buffer 34, and the applied data is transferred to several bit lines selected by column decoder 23.

Figure 3:
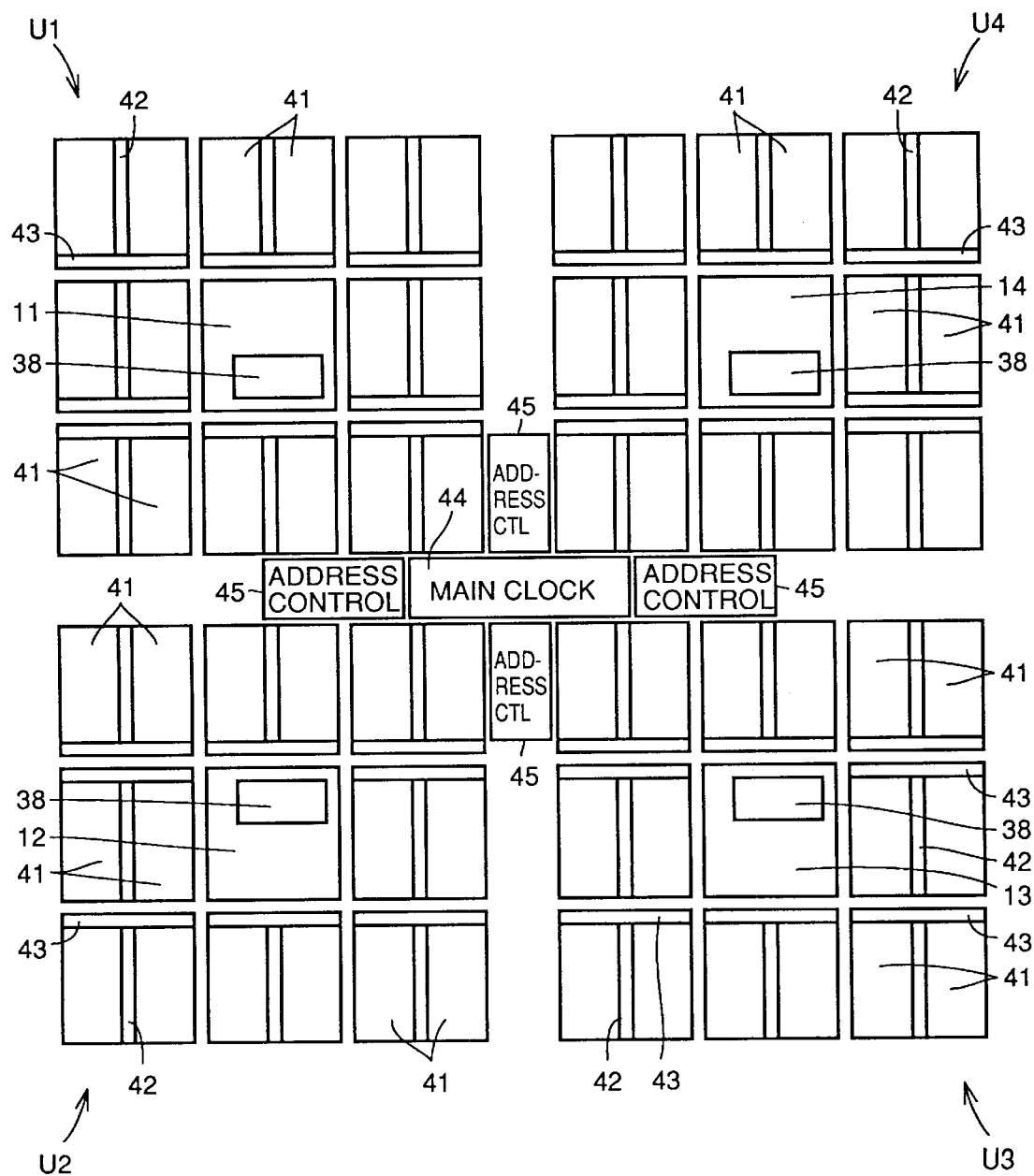
FIG. 3 shows in further detail a layout of the DRAM in FIG. 1.
Figure 4:
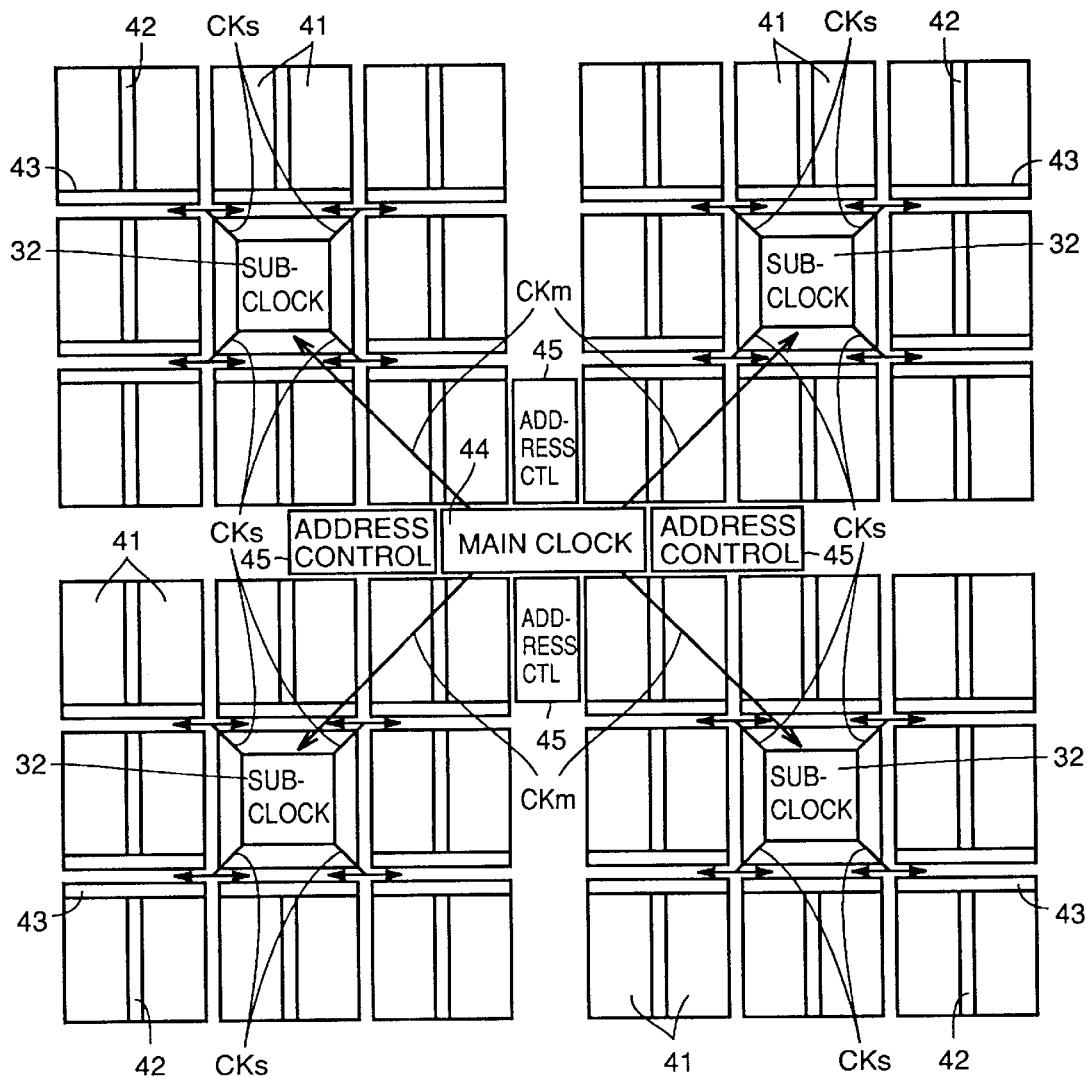
FIG. 4 shows in further detail another layout of the DRAM in FIG. 1.

FIGS. 3 and 4 show in further detail layouts of unit blocks U1–U4 shown in FIG. 1. Referring to FIGS. 3 and 4, memory cell array 16 shown in FIG. 2 is divided into eight subarrays 41, row decoder 22 in FIG. 2 is also divided into eight row decoders 42, and column decoder 23 in FIG. 2 is also divided into eight column decoders 43. Each row decoder 42 is disposed to cross vertically over the corresponding subarray 41. Each column decoder 43 is disposed adjacent to the corresponding subarray 41. Therefore, each of memory blocks B11–B18, B21–B28, B31–B38, and B41–B48 includes subarray 41, row decoder 42, and column decoder 43. Meanwhile, each of peripheral circuits 11–14 includes RAS buffer 27, CAS buffer 28, WE buffer 29, input/output register 33, input buffer 34, and output buffer 35.

Referring again to FIG. 2, one peripheral circuit in the DRAM further includes a redundancy circuit 37 for repairing a defect in the corresponding eight memory blocks. Redundancy circuit 37 includes a program circuit (not shown) in which an address of a defective memory cell can be programmed. When the programmed row address signal is applied, redundancy circuit 37 controls row decoder 22 to select a spare word line instead of the word line which should be selected in response to the row address signal. When the programmed column address signal is applied, redundancy circuit 37 controls column decoder 23 to select a spare bit line instead of the bit line to be selected in response to the column address signal.

Each of peripheral circuits 11–14 in the DRAM further includes a test circuit 38 for testing the corresponding eight memory blocks. Here, an example of such test is the so-called multi-bit test for detecting, after the same data is written in a plurality of memory cells at the same time, consistency or inconsistency in the data which is read out from the plurality of memory cells.

Each of peripheral circuits 11–14 in the DRAM further includes a boosted potential (Vpp) generator 39 and a substrate potential (Vbb) generator 40. Vpp generator 39 generates a boosted potential Vpp for driving, for example, a word line. Vbb generator 40 generates a negative substrate potential Vbb to be applied to semiconductor substrate 10.

Referring again to FIGS. 3 and 4, the DRAM includes a main clock generator 44 and four address control circuits 45. Main clock generator 44 is disposed at the center of unit blocks U1–U4 and is responsive to the external clock signal to generate main clock signal CKm. Main clock signal CKm is applied to each subclock generator 32 in peripheral circuits 11–14. Subclock signal CKs generated by each subclock generator 32 is applied to the corresponding eight memory blocks.

Address control circuit 45 is disposed in the peripheral region of main clock generator 44. Each address control circuit 45 includes address buffer 31 shown in FIG. 2, an address transition detector (ATD) (not shown), and the like.

Figure 5:
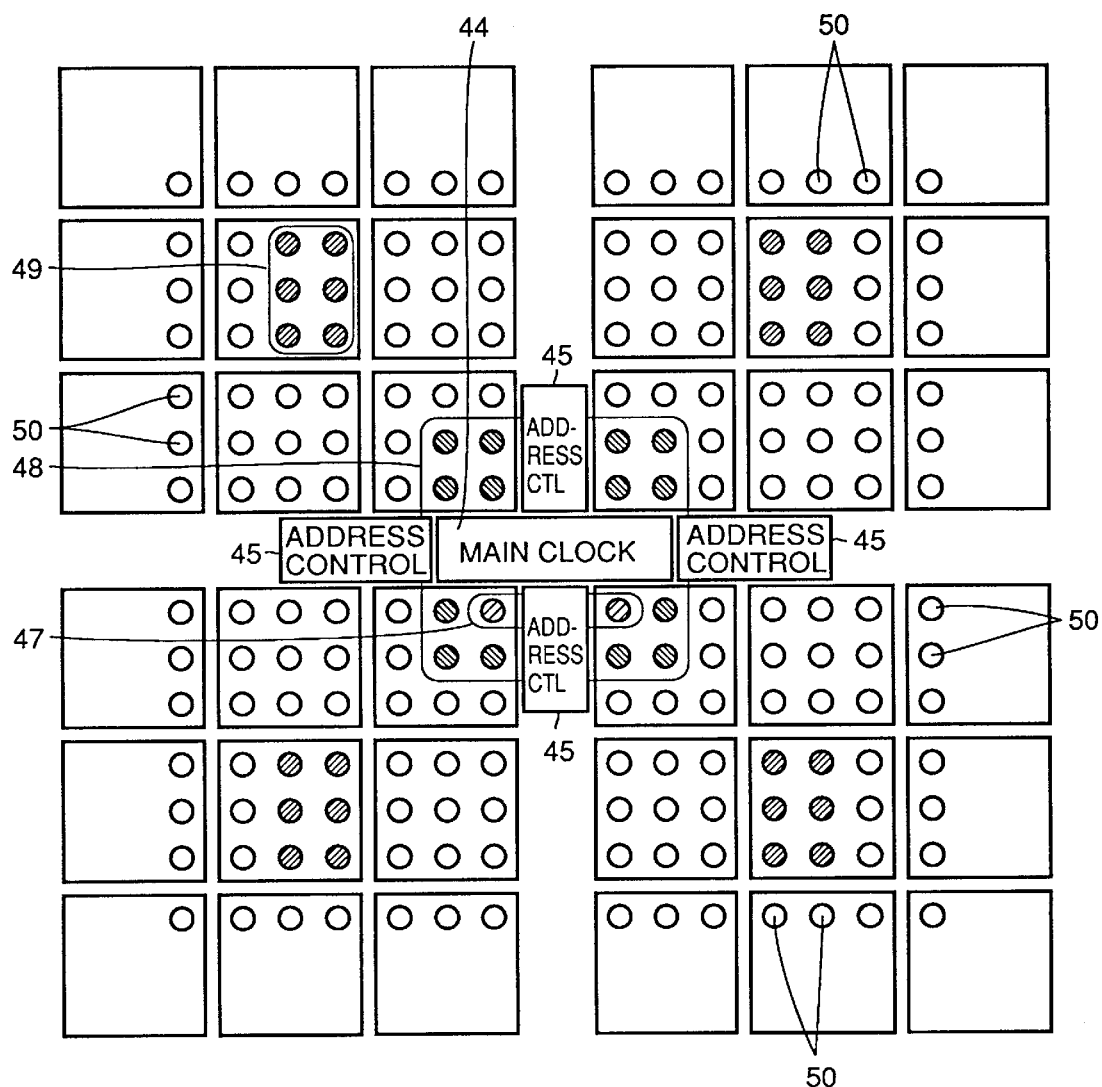
FIG. 5 shows a layout of external terminals in addition to the DRAM in FIG. 1.

FIG. 5 shows external terminals of a grid type arranged in 14 rows and 14 columns in addition to the structures in FIGS. 1–4. These external terminals project from mold resin (not shown) covering the DRAM and have a tip of a hemispherical shape. As shown in FIG. 5, a clock input terminal group 47 is disposed at the center of unit blocks U1–U4, and an address input terminal group 48 is disposed around group 47. Clock input terminal group 47 is connected to main clock generator 44 and includes a clock input terminal for receiving the external clock signal. Address input terminal group 48 is connected to address buffer 31 and includes address input terminal 30 for receiving external address signal AD.

A control input terminal group 49 is disposed on each of peripheral circuits 11–14. Control input terminal group 49 includes control input terminals 24–26 shown in FIG. 2. The remaining external terminals 50 are used for input/output of data, application of power supply, and the like.

As described above, according to the first embodiment, eight memory blocks are arranged to surround each of peripheral circuits 11–14, so that the distance from the peripheral circuit to each memory block is substantially equal, resulting in a substantially equal signal delay. Compared with the case where the peripheral circuit is arranged at the end of the memory cell array, the maximum distance from the peripheral circuit to the memory block is reduced by half, thereby also reducing signal delay by half.

Since the clock input terminal and main clock generator 44 dealing with the clock signal having the highest frequency are arranged at the center of unit blocks U1–U4, the distance from main clock generator 44 to each subclock generator 32 is equal, so that delay in clock signal, that is, clock skew, is made equal. Furthermore, since address input terminal 30 and address control circuit 45 dealing with the address signal having the second highest frequency to the clock signal are arranged near main clock generator 44, the distance from address control circuit 45 to each unit block is substantially equal, so that delay in address signal is substantially equal as well. In addition, since control input terminals 24–26 are arranged on each peripheral circuit, the distance between control input terminals 24–26 and buffers 27–29 is reduced, thereby allowing enhancement in operation speed and reduction in area occupied by the interconnections.

Since such a structure is adopted in the first embodiment, a DRAM with storage capacity of as large as 1 G bit can be implemented.

As main clock generator 44 generates main clock signal CKm and subclock generator 32 generates subclock signal CKs in each of unit blocks U1–U4, subclock signal CKs can be applied at the same timing to any of the memory blocks.

As one test circuit 38 is provided for each unit block, unit blocks U1–U4 can be tested at the same time, thereby reducing time for testing.

Although the DRAM according to the first embodiment includes four unit blocks U1–U4, only one unit block can be provided and the number of blocks is not particularly limited.

Second Embodiment

FIG. 6 shows a layout of a DRAM according to the second embodiment of the present invention. Referring to FIG. 6, according to the second embodiment, peripheral circuit 11 is disposed at the center and 32 (Nth power of 2) memory blocks B1–B32 are disposed to surround peripheral circuit 11. More specifically, memory blocks B1–B32 are arranged in five (odd number) rows L1–L5 and seven (odd number) columns C1–C7 except for the third row of the third, fourth, and fifth columns (L3, C3), (L3, C4), (L3, C5), and peripheral circuit 11 is arranged at the third row of the third, fourth, and fifth columns.

According to the second embodiment, memory blocks B1–B32 are disposed to surround peripheral circuit 11 and memory blocks B1–B32 and peripheral circuit 11 are disposed symmetrically, whereby each distance between peripheral circuit 11 and the memory block is substantially equal and therefore delay in signal is also substantially equal. As a result, a DRAM with a large storage capacity can be implemented.

Third Embodiment

FIG. 7 shows a layout of a DRAM according to the third embodiment of the present invention. Referring to FIG. 7, according to the third embodiment, peripheral circuit 11 is disposed at the center and 16 (Nth power of 2) memory blocks B1–B16 are arranged to surround peripheral circuit 11. More specifically, memory blocks B1–B16 are arranged in three (odd number) rows L1–L3 and six (even number) columns C1–C6 except for the second row of the third column and the fourth column (L2, C3), (L2, C4), and peripheral circuit 11 is arranged at the second row of the third and fourth columns.

According to the third embodiment, memory blocks B1–B16 are arranged to surround peripheral circuit 11 and memory blocks B1–B16 and peripheral circuit 11 are disposed symmetrically, so that the distance from peripheral circuit 11 to each memory block is substantially equal and therefore delay in signal is also substantially equal. As a result, a DRAM with a large storage capacity can be implemented.

Fourth Embodiment

FIG. 8 shows a layout of a DRAM according to the fourth embodiment of the present invention. Referring to FIG. 8, according to the fourth embodiment, peripheral circuit 11 is disposed at the center, and 32 (N power of 2) memory blocks B1–B32 are arranged to surround peripheral circuit 11. More particularly, memory blocks B1–B32 are arranged in six (even number) rows L1–L6 and seven (odd number) columns C1–C7 except for the third row of the second through sixth columns and the fourth row of the second through sixth columns (L3, C2)–(L3, C6) and (L4, C2)–(L4, C6), and peripheral circuit 11 is disposed at the third row of the second through sixth columns and the fourth row of the second through sixth columns.

According to the fourth embodiment, memory blocks B1–B32 are arranged to surround peripheral circuit 11 and memory blocks B1–B32 and peripheral circuit 11 are arranged symmetrically, whereby each distance from peripheral circuit 11 to the memory block is substantially equal and therefore delay in signal is also substantially equal. As a result, a DRAM with a large storage capacity can be implemented.

Fifth Embodiment

FIG. 9 shows a layout of a DRAM according to the fifth embodiment of the present invention. Referring to FIG. 9, according to the fifth embodiment, peripheral circuit 11 is disposed at the center, and 26 (even number) memory blocks (B1–B26) are arranged to surround peripheral circuit 11. More specifically, memory blocks B1–B26 are arranged in five (odd number) rows L1–L5 and six (even number) columns C1–C6 except for the third row of the second through fifth columns (L3, C2)–(L3, C5), and peripheral circuit 11 is disposed at the third row of the second through fifth columns.

According to the fifth embodiment, memory blocks B1–B26 are arranged to surround peripheral circuit 11 in a symmetrical manner, so that the distance from the peripheral circuit 11 to each memory block is substantially equal, and therefore delay in signal is made substantially equal. Consequently, a DRAM with a large storage capacity can be realized.

Sixth Embodiment

FIG. 10 shows a layout of a DRAM according to the sixth embodiment of the present invention. Referring to FIG. 10, according to the sixth embodiment, peripheral circuit 11 is disposed at the center, and 22 (even number) memory blocks B1–B22 are arranged to surround peripheral circuit 11. More particularly, memory blocks B1–B22 are arranged in four (even number) rows L1–L4 and seven (odd number) columns C1–C7 excluding the second row of the third through fifth columns and a third row of the third through fifth columns (L2, C3)–(L2, C5) and (L3, C3)–(L3, C5), and peripheral circuit 11 is disposed at the second row of the third through fifth columns and the third row of the third through fifth columns.

According to the sixth embodiment, memory blocks B1–B22 are arranged to surround peripheral circuit 11 in a symmetrical manner, the distance from peripheral circuit 11 to each memory block is substantially equal, and therefore delay in signal is also substantially equal. As a result, a DRAM with a large storage capacity can be implemented.

Seventh Embodiment

FIG. 11 shows a layout of a DRAM according to the seventh embodiment of the present invention. Referring to FIG. 11, according to the seventh embodiment, peripheral circuit 11 is disposed at the center, and 64 (Nth power of 2) memory blocks B1–B64 are arranged to surround peripheral circuit 11. More particularly, memory blocks B1–B64 are arranged in eight (even number) rows L1–L8 and nine (odd number) columns C1–C9, excluding the fourth row of the third through sixth columns and the fifth row of the third through sixth columns (L4, C3)–(L4, C6) and (L5, C3)–(L5, C6), and peripheral circuit 11 is disposed at the fourth row of the third through sixth columns and the fifth row of the third through sixth columns.

According to the seventh embodiment, since memory blocks B1–B64 are arranged to surround peripheral circuit 11, the distance from peripheral circuit 11 to each memory block is substantially equal to each other and delay in signal is also substantially equal. Consequently, the DRAM with a large storage capacity can be realized.

Eighth Embodiment

Figures 12, 13:
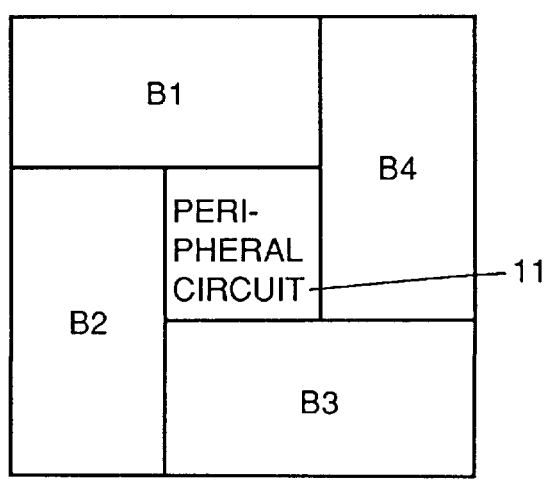

FIG. 12 shows a layout of a DRAM according to the eighth embodiment of the present invention. Referring to FIG. 12, according to the eighth embodiment, peripheral circuit 11 is disposed at the center, and 64 (Nth power of 2) memory blocks B1–B64 are arranged to surround peripheral circuit 11. More particularly, memory blocks B1–B64 are arranged in nine (odd number) rows L1–L9 and eight (even number) columns C1–C8, except for the third row of the fourth and fifth columns, the fourth row of the fourth and fifth columns, the fifth row of the fourth and fifth columns, and the sixth row of the fourth and fifth columns (L3, C4), (L3, C5), (L4, C4), (L4, C5), (LS, C4), (L5, C5), (L6, C4), and (L6, C5). Peripheral circuit 11 is disposed there at the third row of the fourth and fifth columns, the fourth row of the fourth and fifth columns, the fifth row of the fourth and fifth columns, and the sixth row of the fourth and fifth columns.

According to the eighth embodiment, memory blocks B1–B64 are arranged to surround peripheral circuit 11, so that each distance between peripheral circuit 11 and the memory block is substantially equal and therefore delay in signal is substantially equal. As a result, a DRAM with a large storage capacity can be realized.

Ninth Embodiment

FIG. 13 shows a layout of a DRAM according to the ninth embodiment of the present invention. Referring to FIG. 13, peripheral circuit 11 of a square shape is disposed at the center, and four (Nth power of 2) memory blocks B1–B4 are arranged to surround peripheral circuit 11. As recited in the above-mentioned *VLSI Memory*, pp. 132 and 133, the ratio of a shorter side to a longer side of a memory block is generally 2. Each of memory blocks B1–B4 in the ninth embodiment has a rectangular shape with the ratio of the shorter side to the longer side of 2. Each memory block is arranged so that a shorter side of each memory block is adjacent to a longer side of another memory block and a longer side of each memory block is located on an extension of a shorter side of the above-mentioned another memory block.

It is desirable that signals such as a control signal and a data signal are applied via the center of the longer side from peripheral circuit 11 to each memory block. This is because the longest signal line is made equal in length to the shorter side to allow high speed operation.

According to the ninth embodiment, memory blocks B1–B4 are arranged to surround peripheral circuit 11 in a symmetrical manner, so that each distance between peripheral circuit 11 and the memory block is substantially equal; and therefore delay in signal is substantially equal. As a result, a DRAM with a large storage capacity can be implemented.

Tenth Embodiment

Figure 14:
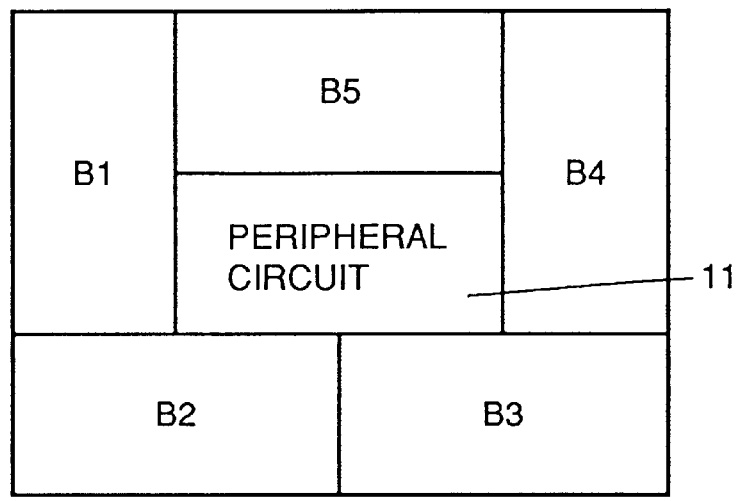

FIG. 14 shows a layout of a DRAM according to the tenth embodiment of the present invention. Referring to FIG. 14, according to the tenth embodiment, peripheral circuit 11 is disposed at the center surrounded by five memory blocks B1–B5. The tenth embodiment is different from the ninth embodiment described above in that peripheral circuit 11 has the same shape as the memory block and the number of memory blocks B1–B5 is five.

Therefore, the DRAM comprises:

a semiconductor substrate;

first through fifth memory blocks B1–B5 arranged on said semiconductor substrate to surround the center of said semiconductor substrate, each having a rectangular shape and including a plurality of word lines, a plurality of bit lines crossing said word lines, and a plurality of memory cells corresponding to crossing points of said word lines and said bit lines; and a peripheral circuit 11 for said first through fifth memory blocks B1–B5 arranged on said semiconductor substrate at said center; wherein said first memory block B1 is arranged so that one longer side of said first memory block B1 is adjacent to one shorter side of said fifth memory block B5 and one shorter side of said first memory block B1 is located on an extension of one longer side of said fifth memory block B5;

said second memory block B2 is arranged so that one longer side of said second memory block B2 is adjacent to another shorter side of said first memory block B1 and one shorter side of said second memory block B2 is located on an extension of another longer side of said first memory block B1;

said third memory block B3 is arranged so that one shorter side of said third memory block B3 is adjacent to another shorter side of said second memory block B2 and one longer side of said third memory block B3 is located on an extension of another longer side of said second memory block B2;

said fourth memory block B4 is arranged so that one shorter side of said fourth memory block B4 is adjacent to another longer side of said third memory block B3 and one longer side of said fourth memory block B4 is located on an extension of another shorter side of said third memory block B3; and said fifth memory block B5 is arranged so that another shorter side of said fifth memory block B5 is adjacent to another longer side of said fourth memory block B4 and said one longer side of said fifth memory block B5 is located on an extension of another shorter side of said fourth memory block B4.

According to the tenth embodiment, memory blocks B1–B5 are arranged surrounding peripheral circuit 11 to be axially symmetrical, so that the distance from peripheral circuit 11 to each memory block is substantially equal to each other, and therefore delay in signal is also substantially equal. As a result, a DRAM with a large storage capacity can be implemented.

Eleventh Embodiment

Figure 15:
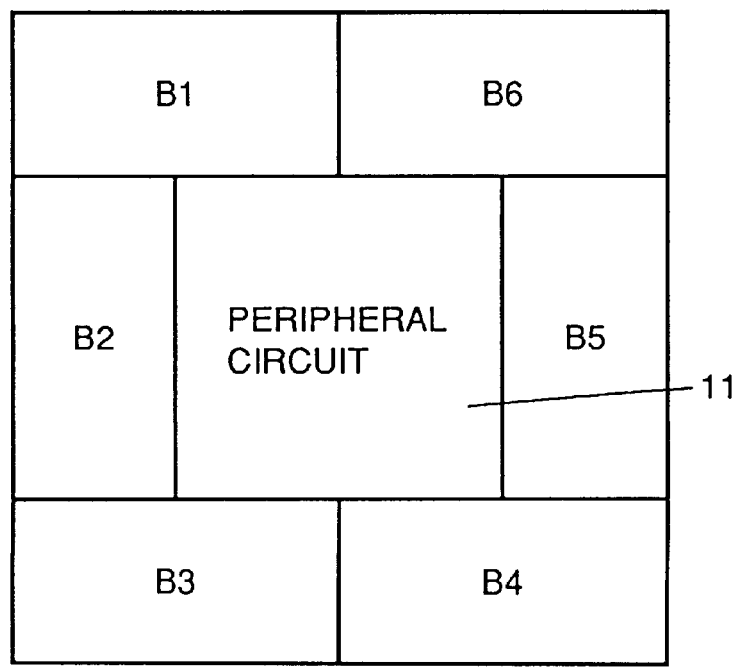
Figure 16:
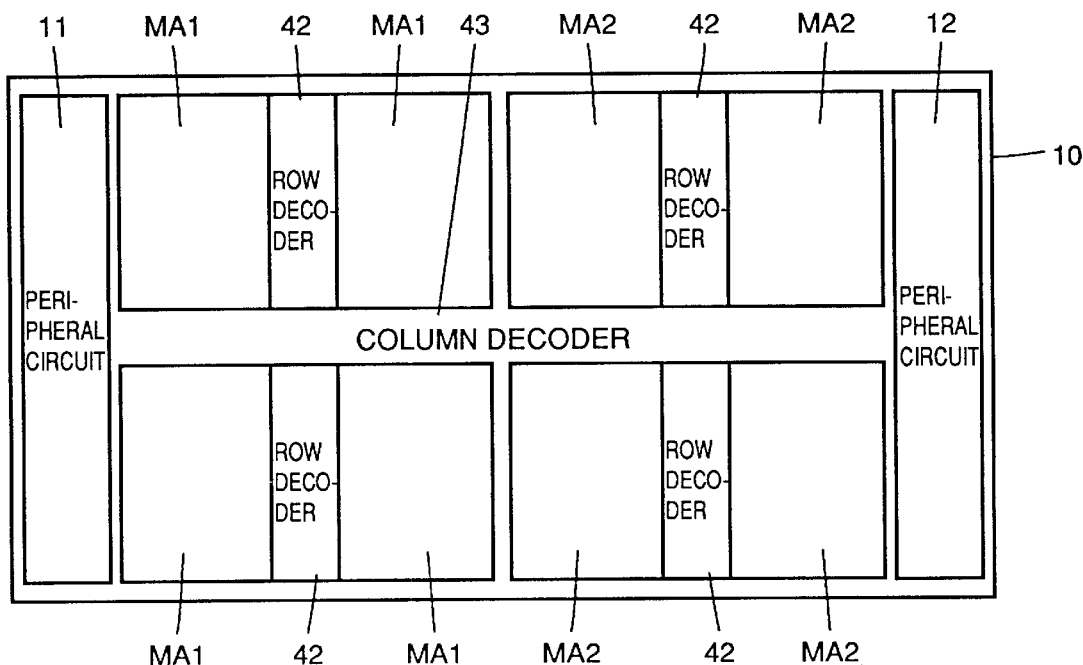
FIGS. 16 and 17 show conventional layouts of DRAMs of 64 K bits and 64 M bits, respectively.
Figure 17:
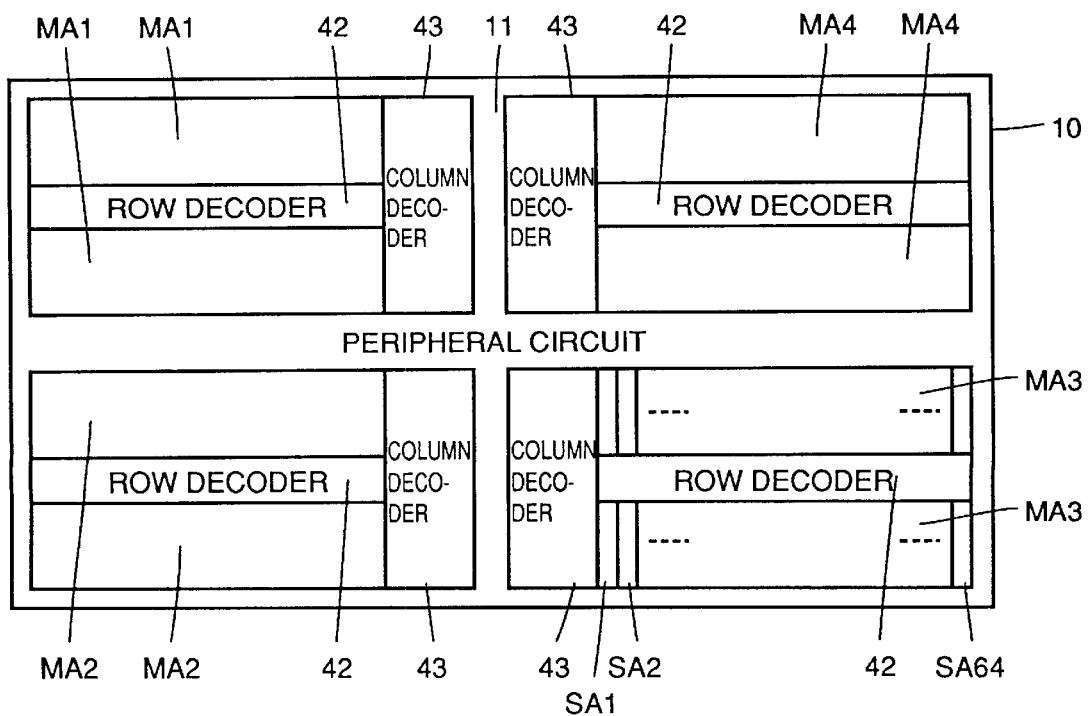

FIG. 15 shows a layout of a DRAM according to the eleventh embodiment of the present invention. Referring to FIG. 15, according to the eleventh embodiment, peripheral circuit 11 is disposed at the center, and six (even number) memory blocks B1–B6 are arranged to surround peripheral circuit 11. The eleventh embodiment is different from the ninth and tenth embodiments in that peripheral circuit 11 is a square corresponding to two memory blocks and the number of memory blocks B1–B6 is six.

Therefore, the DRAM comprises:

a semiconductor substrate;

first through sixth memory blocks B1–B6 arranged on said semiconductor substrate to surround the center of said semiconductor substrate, each having a rectangular shape and including a plurality of word lines 17, a plurality of bit lines crossing said word lines, and a plurality of memory cells corresponding to crossing points of said word lines and said bit lines; and a peripheral circuit 11 for said first through sixth memory blocks B1–B6 disposed on said semiconductor substrate at said center; wherein said first memory block B1 is arranged so that one shorter side of said first memory block B1 is adjacent to one shorter side of said sixth memory block B6 and one longer side of said first memory block B1 is located on an extension of one longer side of said sixth memory block B6;

said second memory block B2 is arranged so that one shorter side of said second memory block B2 is adjacent to another longer side of said first memory block B1 and one longer side of said second memory block B2 is located on an extension of another shorter side of said first memory block B1;

said third memory block B3 is arranged so that one longer side of said third memory block 13 is adjacent to another shorter side of said second memory block B2 and one shorter side of said third memory block B3 is located on an extension of said one longer side of said second memory block B2;

said fourth memory block B4 is arranged so that one shorter side of said fourth memory block B4 is adjacent to another shorter side of said third memory block 13 and one longer side of said fourth memory block B4 is located on an extension of another longer side of said third memory block B3;

said fifth memory block B5 is arranged so that one shorter side of said fifth memory block B5 is adjacent to another longer side of said fourth memory block B4 and one longer side of said fifth memory block B5 is located on an extension of another shorter side of said fourth memory block B4; and said sixth memory block B6 is arranged so that another longer side of said sixth memory block B6 is adjacent to another shorter side of said fifth memory block B5 and another shorter side of said sixth memory block B6 is located on an extension of said one longer side of said fifth memory block B5.

According to the eleventh embodiment, since memory blocks B1–B6 are arranged to surround peripheral circuit 11 in a symmetrical manner, the distance from peripheral circuit 11 to each memory block is substantially equal, and therefore delay in signal is substantially equal. Consequently, a DRAM with a large storage capacity can be realized.

While embodiments of the present invention are described in detail, the scope of the present invention is not limited to the embodiments described above. For example, the present invention is also applicable to an SRAM (Static Random Access Memory) and the number of memory blocks is not particularly limited.

It is understood that the present invention can be implemented with various improvements and modifications by those skilled in the art without departing from the spirit and scope of the present invention. It is intended that the spirit and scope of the present invention is limited only by the terms of the appended claims.

What is claimed is:

1. A semiconductor memory device, comprising:
   a semiconductor substrate;
   a plurality of memory blocks, each memory block having an outer peripheral boundary delineating an entire area of the memory block with each memory block including a plurality of word lines, a plurality of bit lines crossing said plurality of word lines, and a plurality of memory cells corresponding to crossing points of said plurality of word lines and said plurality of bit lines positioned within the entire area of the memory block, a portion of the outer peripheral boundary of said each memory block corresponding to a portion of the outer peripheral boundary of each adjacent memory block, said plurality of memory blocks being arranged on said semiconductor substrate to completely surround a center of said semiconductor substrate; and
   a peripheral circuit for said plurality of memory blocks arranged on said semiconductor substrate at a center of said memory blocks, completely surrounded by said plurality of memory blocks.

2. The semiconductor memory device according to claim 1, wherein an even number of said memory blocks are provided.

3. The semiconductor memory device according to claim 2, wherein the number of said memory blocks provided is a power of 2.

4. The semiconductor memory device according to claim 1, wherein said memory blocks are arranged in a plurality of rows and in a plurality of columns.

5. The semiconductor memory device according to claim 4, wherein an odd number of said rows and an odd number of said columns are provided.

6. The semiconductor memory device according to claim 4, wherein an even number of said rows are provided and an odd number of said columns are provided.

7. The semiconductor memory device according to claim 4, wherein an even number of said rows are provided and an even number of said columns are provided.

8. A semiconductor memory device, comprising
   four unit blocks arranged in two rows and two columns, wherein each of said unit blocks includes
      eight memory blocks arranged in three rows and three columns except for the second row of the second column, each including a plurality of word lines, a plurality of bit lines crossing said plurality of word lines, and a plurality of memory cells corresponding to said plurality of word lines and said plurality of bit lines, and
      a peripheral circuit for said eight memory blocks arranged at said second row of said second column.

9. The semiconductor device according to claim 8, wherein said each memory block further includes a row decoder for selecting a word line in response to an internal row address signal, a column decoder for selecting a bit line in response to an internal column address signal.

10. The semiconductor memory device according to claim 9, wherein said peripheral circuit includes
    an address buffer responsive to an external address signal for generating the internal row address signal and the internal column address signal,
    a row address strobe buffer responsive to an external row address strobe signal for generating an internal row address strobe signal, and
    a column address strobe buffer responsive to an external column address strobe signal for generating an internal column address strobe signal; wherein
    said row decoder incorporates said internal row address signal in response to said internal row address signal; and
    said column decoder incorporates said internal column address signal in response to said internal column address signal.

11. The semiconductor memory device according to claim 9, wherein said peripheral circuit further includes an input/output interface circuit for input/output of data of said memory cell.

12. The semiconductor memory device according to claim 11, wherein said peripheral circuit further includes a redundancy circuit for repairing a defect of said memory block.

13. A semiconductor memory device, comprising:
    a semiconductor substrate;
    first through fourth memory blocks arranged on said semiconductor substrate to surround a center of said semiconductor substrate, each memory block having a rectangular shape and including a plurality of word lines, a plurality of bit lines crossing said plurality of word lines, and a plurality of memory cells corresponding to crossing points of said plurality of word lines and said plurality of bit lines; and
    a peripheral circuit for said first through fourth memory blocks, disposed on said semiconductor substrate at a center of said first through fourth memory blocks; wherein
    said first memory block is arranged so that one shorter side of said first memory block is adjacent to one longer side of said fourth memory block and one longer side of said first memory block is located on an extension of one shorter side of said fourth memory block,
    said second memory block is arranged so that one shorter side of said second memory block is adjacent to another longer side of said first memory block and one longer side of said second memory block is located on an extension of another shorter side of said first memory block,
    said third memory block is arranged so that one shorter side of said third memory block is adjacent to another longer side of said second memory block and one longer side of said third memory block is located on an extension of another shorter side of said second memory block, and said fourth memory block is arranged so that another shorter side of said fourth memory block is adjacent to another longer side of said third memory block and another longer side of said fourth memory block is located on an extension of another shorter side of said third memory block.

* * * * *